Feb. 4, 1964 A. GINGRANDE ET AL 3,120,029

MOLD FOR CASTING ELECTRICAL COMPONENT MOUNTING PANELS

Filed March 13, 1961 2 Sheets-Sheet 1

INVENTORS
A. GINGRANDE
G. J. MAROTTA
BY W. C. Parnell
ATTORNEY

MOLD FOR CASTING ELECTRICAL COMPONENT MOUNTING PANELS

Filed March 13, 1961 2 Sheets-Sheet 2

INVENTORS
A. GINGRANDE
G. J. MAROTTA
By W. C. Parnell
ATTORNEY

United States Patent Office 3,120,029
Patented Feb. 4, 1964

3,120,029

MOLD FOR CASTING ELECTRICAL COMPONENT MOUNTING PANELS

Arthur Gingrande, Boxford, and George J. Marotta, Andover, Mass., assignors to Western Electric Company, Incorporated, New York, N.Y., a corporation of New York Filed Mar. 13, 1961, Ser. No. 95,104
7 Claims. (Cl. 18—47)

This invention relates to molds for casting articles so as to be partially embedded in the casting material and particularly to molds for casting electrical component mounting panels of an insulating plastic material, such as disclosed in copending application Serial Number 2,376, filed by Herbert E. Parker, Richard A. Sullivan, Richard R. Whipple on January 14, 1960, now Patent 3,076,230 and as used in the method disclosed in our copending application Serial Number 95,990 filed on March 15, 1961, both applications being assigned to the same assignee as the present invention.

Electrical components may be advantageously mounted on an insulated plastic panel in such manner that the component bodies are located on one side of the panel and the conductive leads of the components protruding from another side of the panel. Necessary wiring operations may be easily accomplished on the protruding ends of the conductive leads. One method of so mounting electrical components consists of supporting the components by the conductive leads in a mold and pouring insulating plastic material about the leads to a desired depth, allowing the plastic material to harden and then separating the hardened panel from the mold. The panel then supporting the components by the embedded portion of the conductive leads with the components on one side of the panel, not encapsulated, but readily accessible for repair, replacement, or adjustment, and the ends of the leads protruding from the opposite side of the panel.

In making cast electrical component mounting panels, of prime importance is the construction of the casting mold in which the components must be supported in proper position during the casting operation so that they will be in predetermined fixed relationship to each other in the finished panel. The protruding ends of the conductive leads must also be free and clean of any of the insulating plastic casting material to facilitate the lead wiring operations.

The object of this invention is an improved mold which will simplify and expedite the manufacture of electrical component mounting panels.

An important feature of the invention is a mold composed of a material having such physical properties that the component leads can be inserted into the material which will firmly support the components by the inserted lead ends and prevent the seepage of casting material onto the inserted portions.

Another feature of the invention is a flexible mold of a material which is easily stripped intact from the hardened mounting panel without the use of mold release agents.

Another feature of the invention is a re-usable mold containing marks indicating points of insertion of the component leads, also wiring paths and other circuit data to be transferred to the hardened panel and serve as a guide for later wiring operations.

Still another feature of the invention is a mold composed of transparent or translucent material such that a pictorial representation of the proper positions of the components, viewed through the mold material, serves as a guide for the insertion of the component leads in proper position.

In one embodiment of the invention, the mold is made of a transparent thermoplastic material and has a pictorial representation of the proper positions of the components mounted on one side so as to be visible through the mold and serve as a guide to the insertion of the component leads.

In a preferred embodiment, where the mounting panel is cast from cold casting epoxy resin, the mold material may be modified cellulose acetate butyrate. The purpose of the modification, which consists of the addition of a stabilizer, wax, and a plasticizer, is to impart to the mold the required flexibility so as to be readily stripped from the casting and to be easily pierceable. Similar results are achievable with other materials.

These and other objects and features of the invention will be more clearly understood from the following detailed description when read in conjunction with the drawings, in which.

Figure 1:
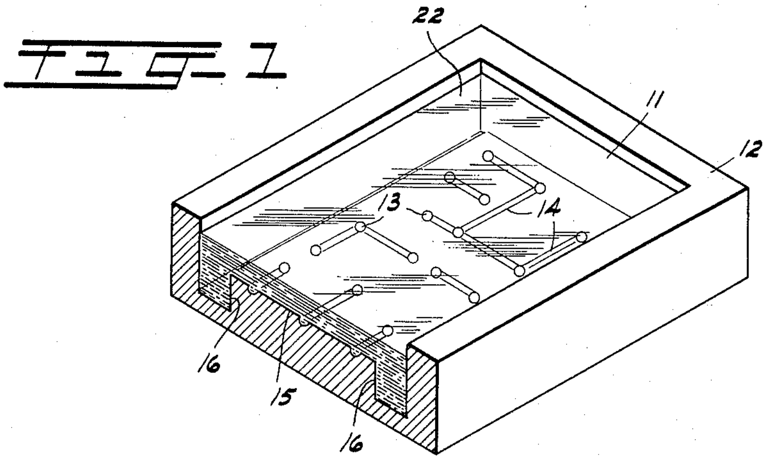
FIG. 1 is an isometric view, partly in section, of the mold material being cast in a master mold.
Figure 2:
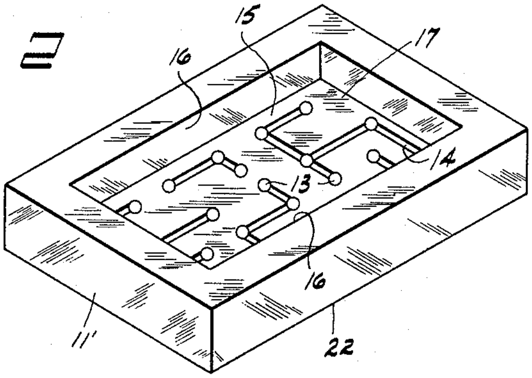
FIG. 2 is an isometric view, of one embodiment of the invention, showing the mold containing indicating marks.

Referring now to the drawings, mold material 11, a plastic material, is cast in a master mold 12 of desired configuration and which may be conveniently made of a metal, such as aluminum. If desired, marks 13 indicating points of insertion of component leads and wiring paths 14 may be embossed or engraved in the master mold 12.

When the mold material 11 has set, the mold 11', a one-piece cast mold having a recessed face portion 15 and elevated wall portions 16 forming a molding cavity 17, is removed from the master mold 12. Thus, the recessed face portion 15 of the mold 11' is a closed surface with no preformed holes therein. With the entire mold 11' also being composed of modified cellulose acetate butyrate, or of material exhibiting similar characteristics, it is non-porous as well as pierceable by the leads of electrical components. Marks 13 indicating points of insertion of component leads and wiring paths 14 are contained on the inner surface of recessed face portion 15 in the opposite sense of their appearance in the master mold 12, e.g., an engraved marking in the master mold 12 will appear as an embossed marking in the cast mold 11', and will appear as an engraved marking on a hardened mounting panel, such as 18, cast in the cast mold 11'.

Figure 3:
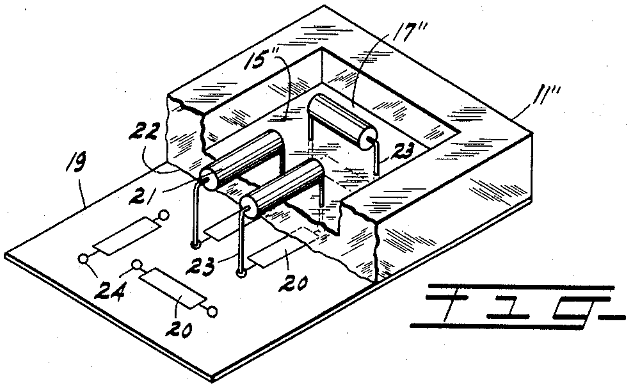
FIG. 3 is an isometric view, partly in section, of another embodiment of the invention, showing a transparent mold having a pictorial representation mounted thereon and electrical components inserted therein.
Figure 5:
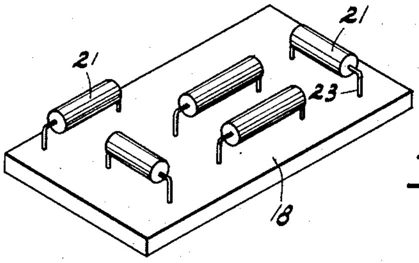
Figure 4:
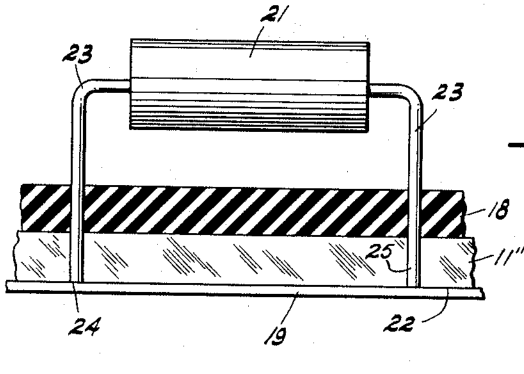
FIG. 4 is a cross-section view, showing an electrical component and a portion of the mounting panel prior to stripping the mold from the hardened panel; and, FIG. 5 is an isometric view of a hardened mounting panel from which the mold has been stripped.

In FIG. 3, cast mold 11'', similar to 11', has a pictorial representation 19 of the proper positions 20 of electrical components 21 such as resistors, capacitors, etc., to be mounted in a finished mounting panel 18, mounted on the bottom face 22 of cast mold 11'' in such position as to be visible through the recessed face portion 15'' and serve as a guide for the insertion of the component conductive leads 23 into the recessed face portion 15'' of cast mold 11'' in register with the insertion points 24 of the pictorial representation 19.

The material of mold 11'' firmly supports the components 21 by the inserted portions 25 of the conductive leads 23 in predetermined fixed relation during the casting of an insulating platic panel material 18 into the mold cavity 17'' in such manner that none of the panel casting material 18 will seep onto the inserted portions 25 of leads 23.

After the panel casting material 18 hardens to desired consistency, the mold 11'' may be easily stripped from the panel 18 and re-used or melted and re-cast in another master mold.

It will be noted that a number of plastic molds may be easily cast from a single master mold so that casting a quantity of mounting panels is rendered simple and economical.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. A mold for casting insulating mounting panels for electrical components with metallic leads comprising a body including plastic material having a flat closed base portion and integral side walls defining a cavity, said material being non-porous and of such consistency that it is impermeable to the casting material and pierceable by the said leads to hold the components in fixed relationship during casting.

2. A mold for casting insulating mounting panels for electrical components with metallic leads comprising a body of modified cellulose acetate butyrate having a flat closed base portion and integral side walls defining a cavity, said modified cellulose acetate butyrate being non-porous and impermeable to the casting material and pierceable by the leads to hold the components in fixed relationship during casting.

3. A mold according to claim 1, wherein the recessed portion includes marks indicating the points of insertion of the conductive leads.

4. A mold for casting insulating mounting panels for electrical components with metallic leads comprising a body including translucent plastic material having a flat closed base portion and integral side walls defining a cavity, said material being non-porous and of such consistency that it is impermeable to the casting material and pierceable by the said leads to hold the components in fixed relationship during casting.

5. A mold according to claim 4 in combination with a pictorial representation of the proper position of the components mounted on one face of said body so as to be visible through said body.

6. A mold for casting insulating mounting panels for electrical components with metallic leads comprising a body including plastic material having a flat closed base portion and integral side walls defining a cavity, said material being non-porous and of such consistency that it is impermeable to the casting material and pierceable by the said leads to hold the components in fixed relationship during casting and that it is sufficiently flexible so as to be stripped intact from the mounting panel after casting.

7. A mold for casting insulating mounting panels for electrical components with metallic leads comprising a body of modified cellulose acetate butyrate having a flat closed base portion and integral side walls defining a cavity, said modified cellulose acetate butyrate being non-porous and impermeable to the casting material and pierceable by the leads to hold the components in fixed relationship during casting and being sufficiently flexible so as to be stripped intact from the mounting panel after casting.

References Cited in the file of this patent

UNITED STATES PATENTS

| | | |
|---|---|---|
| 2,065,934 | Deutschmann | Dec. 29, 1936 |
| 2,391,432 | Marschner et al. | Dec. 25, 1945 |
| 2,694,228 | Mathis | Nov. 16, 1954 |
| 2,837,855 | Hoke | June 10, 1958 |
| 2,905,580 | Kreier | Sept. 22, 1959 |
| 2,917,782 | Goldwag | Dec. 22, 1959 |
| 3,019,489 | Burg | Feb. 6, 1962 |